United States Patent
O'Brien

(10) Patent No.: US 7,707,022 B2
(45) Date of Patent: *Apr. 27, 2010

(54) MULTIPLE DEVICE SCAN CHAIN EMULATION/DEBUGGING

(75) Inventor: James J. O'Brien, Hull, MA (US)

(73) Assignee: Wind River Systems, Inc., Alameda, CA (US)

( * ) Notice: Subject to any disclaimer, the term of this patent is extended or adjusted under 35 U.S.C. 154(b) by 1026 days.

This patent is subject to a terminal disclaimer.

(21) Appl. No.: 11/057,816

(22) Filed: Feb. 14, 2005

(65) Prior Publication Data

US 2006/0195739 A1 Aug. 31, 2006

Related U.S. Application Data

(63) Continuation of application No. 09/921,250, filed on Aug. 2, 2001, now Pat. No. 6,886,110.

(60) Provisional application No. 60/252,316, filed on Nov. 21, 2000.

(51) Int. Cl.
*G06F 9/455* (2006.01)
*G06F 11/00* (2006.01)

(52) U.S. Cl. .............................. 703/24; 703/25; 714/34

(58) Field of Classification Search .................. 703/24, 703/25; 714/34
See application file for complete search history.

(56) References Cited

U.S. PATENT DOCUMENTS

| | | | | |
|---|---|---|---|---|
| 6,578,167 B2 * | 6/2003 | Boorom et al. | ............. | 714/727 |
| 6,611,796 B1 * | 8/2003 | Natarajan et al. | ............. | 703/24 |
| 6,691,251 B2 * | 2/2004 | Wong | ......................... | 714/28 |
| 6,754,852 B2 * | 6/2004 | Swoboda | ..................... | 714/34 |
| 6,886,110 B2 * | 4/2005 | O'Brien | ..................... | 714/34 |
| 7,053,470 B1 * | 5/2006 | Sellers et al. | ............... | 257/678 |
| 7,076,419 B2 * | 7/2006 | Swoboda | ..................... | 703/24 |
| 7,131,033 B1 * | 10/2006 | Roper et al. | .................. | 714/30 |
| 2002/0026304 A1 * | 2/2002 | Deao et al. | .................... | 703/27 |
| 2002/0099977 A1 * | 7/2002 | Wong | .......................... | 714/28 |
| 2002/0152439 A1 * | 10/2002 | Kim et al. | ................... | 714/734 |
| 2003/0140291 A1 * | 7/2003 | Brown et al. | ................ | 714/724 |
| 2003/0225566 A1 * | 12/2003 | O'Brein et al. | ............... | 703/24 |
| 2003/0233221 A1 * | 12/2003 | O'Brien et al. | ............... | 703/23 |
| 2005/0235186 A1 * | 10/2005 | Wang et al. | ................. | 714/728 |
| 2007/0038433 A1 * | 2/2007 | Swoboda | ..................... | 703/23 |

OTHER PUBLICATIONS

"Atair Multi Device Debugging Technical Information" by F. Polzer, Atair Software Gmbh, Apr. 2001.*

(Continued)

*Primary Examiner*—Kamini S Shah
*Assistant Examiner*—Akash Saxena
(74) *Attorney, Agent, or Firm*—Fay, Kaplun & Marcin, LLP

(57) ABSTRACT

A method and system is provided for emulating individual JTAG devices in a multiple device boundary scan chain. The method includes coupling an emulator to the scan chain, and obtaining the topology of the scan chain. One device within the scan chain is then selected, and at least one other device within the scan chain is placed into bypass mode. Emulation instructions are sent to the scan chain, so that the emulation instructions bypass the at least one other device and are executed by the one device.

20 Claims, 11 Drawing Sheets

OTHER PUBLICATIONS

"New QNX Momemtics Development Suite Simplifies Embedded Programming" Press Release Jun. 4, 2002.*

"JTAG Testing of Multichip Modules" IDT Application Notes AN-411 released Apr. 2004.*

Hierarchical Scan Description Language Syntax Specification—Revision A Aug. 31, 1992 Authors: Adam Sheppard, Giridhar V., Asset InterTech, Inc. & Texas Instruments Inc.*

JTAG Data formats; Texas Instruments p. 1-14, Publication year 1999.*

* cited by examiner

MULTIPLE DEVICE SCAN CHAIN EMULATION/DEBUGGING

RELATED APPLICATION

This application is a continuation of U.S. Non-Provisional application Ser. No. 09/921,250, Filed Aug. 2, 2001, now U.S. Pat. No. 6,886,110, which claims the benefit of U.S. Provisional Application Ser. No. 60/252,316, filed Nov. 21, 2000.

BACKGROUND

Since the mid-1970s, the structural testing of loaded printed circuit boards (PCBs) has relied very heavily on the use of the so-called in-circuit "bed-of-nails" technique (FIG. 1). This method of testing makes use of a fixture containing a bed-of-nails to access individual devices on the board through test lands laid into the copper interconnect, or other convenient contact points. Testing then generally proceeds in two phases: the power-off tests followed by power-on tests.

Power-off tests check the integrity of the physical contact between nail and the on-board access point. They then may carry out open and shorts tests based on impedance measurements. Power-on tests apply stimulus to a chosen device on a board, with an accompanying measurement of the response from that device. Other devices that are electrically connected to the device-under-test are usually placed into a safe state (a process called "guarding"). In this way, the tester is able to check the presence, orientation, and bonding of the device-under-test in place on the board.

Fundamentally, the in-circuit bed-of-nails technique relies on physical access to all devices on a board. For plated-through-hole technology, the access is usually gained by adding test lands into the interconnects on the "B" side of the board—that is, the solder side of the board. The advent of surface mount devices meant that manufacturers began to place components on both sides of the board—the "A" side and the "B" side. The smaller pitch between the leads of surface-mount components caused a corresponding decrease in the physical distance between the interconnects. This had serious impact on the ability to place a nail accurately onto a target test land. The question of access was further compounded by the development of multi-layer boards.

In the 1980s a group known as the Joint Test Action Group (JTAG) examined the problem and its possible solutions. Their preferred method of solution was based on the concept of placing a series of cells forming a serial shift register, around the boundary of the device. This shift register became known as a boundary-scan register. The JTAG approach ultimately became an international standard known as the IEEE 1149.1 "Test Access Port and Boundary-Scan Architecture". As used herein, the terms "JTAG", "JTAG compliant", and/or "IEEE 1149.1" are interchangeably used to refer to this standard (including subsequent revisions and modifications thereof) and/or devices that are compliant with this standard.

The boundary-scan cells forming the boundary-scan register essentially formed a series of "virtual nails", which may be used in a manner similar to the actual nails discussed above to test the presence, orientation, and bonding of devices in place on a board. In particular, the prime function of the bed-of-nails in-circuit tester, and thus, the boundary-scan architecture, has been to test for manufacturing defects, such as missing devices, damaged devices, open and short circuits, misaligned devices, and wrong devices.

It was assumed that devices had already been tested for functionality when they existed only as devices (i.e., prior to assembly on the board). Boundary-scan architecture was viewed as an alternative way of testing for the presence of manufacturing defects, including defects caused by shock, such as electrical shock (e.g., electrostatic discharge), mechanical shock (e.g., clumsy handling), or thermal shock (e.g., hot spots caused by the solder operation). A defect, if it occurs, is likely present either in the periphery of the device (leg, bond wire, driver amplifier), in the solder, or in the interconnect between devices. It is very unusual to find damage to the core logic without there being some associated damage to the periphery of the device. In-circuit testers thus generally were not configured or intended to prove the overall functionality of the devices.

However, with the proliferation of complex board mounted systems, it is often desirable to effect in-depth testing of individual components. A need thus exists for a method and apparatus for emulating and/or debugging individual devices using existing scan chain architecture.

SUMMARY

According to an embodiment of this invention, a method is provided for emulating individual JTAG devices in a multiple device boundary scan chain. The method includes coupling an emulator to the scan chain, and obtaining the topology of the scan chain. One device within the scan chain is then selected, and at least one other device within the scan chain is placed into bypass mode. Emulation instructions are sent to the scan chain, so that the emulation instructions bypass the at least one other device and are executed by the one device.

In another aspect, the present invention includes a graphical user interface (GUI) for an emulator configured to emulate individual JTAG devices in a multiple device boundary scan chain. The GUI includes a user-selectable list of devices, a graphical display of the scan chain, and at least one scan chain parameter field.

A further aspect of the present invention includes a system for emulating individual JTAG devices in a multiple device boundary scan chain. The system includes an emulator couplable to the scan chain, and a topology module configured to obtain the topology of the scan chain. The system also includes a selection module configured to select one device within the scan chain, and a bypass module configured to place at least one other device within the scan chain into bypass mode. An emulation instruction module is configured to send emulation instructions to the scan chain, so that the emulation instructions bypass the at least one other device and are executed by the one device.

A still further aspect of this invention includes an article of manufacture for emulating individual JTAG devices in a multiple device boundary scan chain, the article of manufacture including a computer usable medium having a computer readable program code embodied therein. The computer usable medium includes computer readable program code configured for integration with an emulator, the emulator being couplable to the scan chain. This aspect further includes computer readable program code for obtaining the topology of the scan chain, and computer readable program code for selecting one device within the scan chain. Computer readable program code is also provided for placing at least one other device within the scan chain into bypass mode. Computer readable program code is also provided for sending emulation instructions to the scan chain, so that the emulation instructions bypass the at least one other device and are executed by the one device.

BRIEF DESCRIPTION OF THE DRAWINGS

The above and other features and advantages of this invention will be more readily apparent from a reading of the following detailed description of various aspects of the invention taken in conjunction with the accompanying drawings, in which.

DETAILED DESCRIPTION

Figure 1:
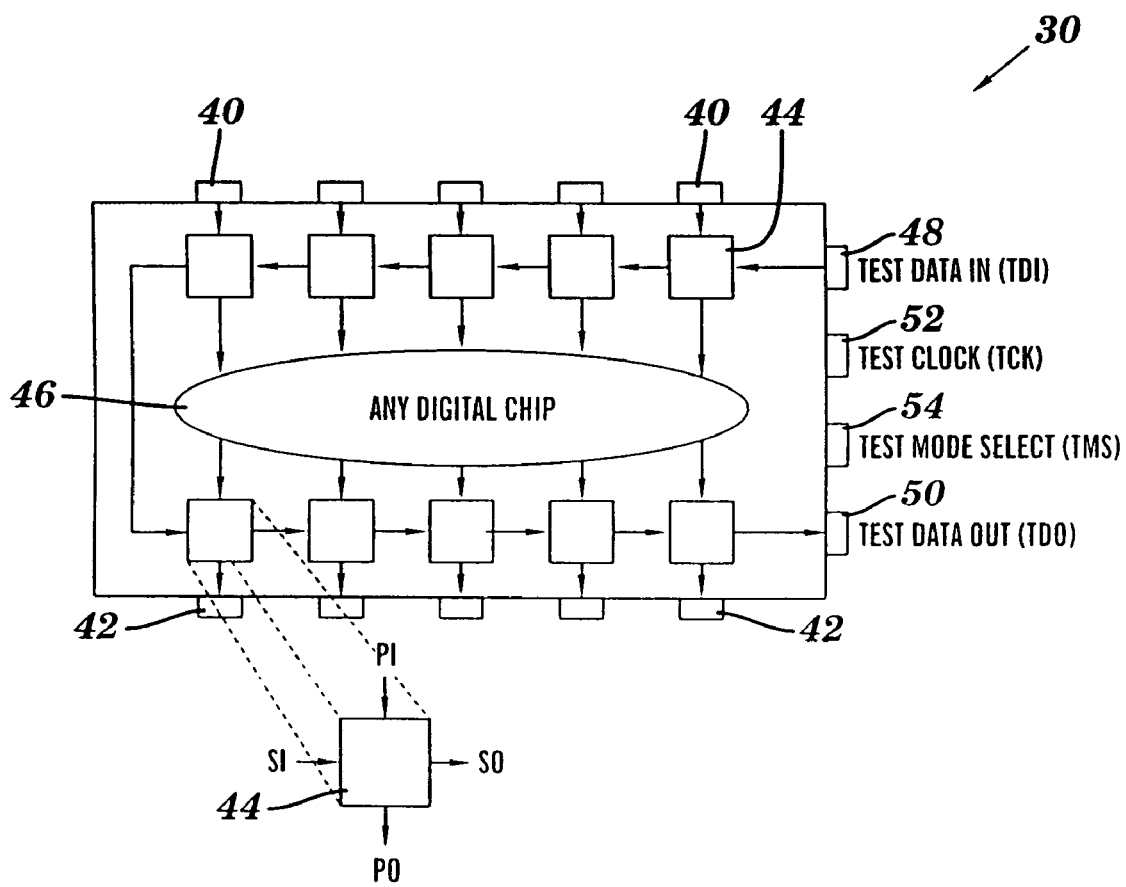
FIGS. 1 to 5 are schematic representations of various aspects of boundary scan architecture of the prior art.

Referring to the figures set forth in the accompanying drawings, the illustrative embodiments of the present invention will be described in detail hereinbelow. For clarity of exposition, like features shown in the accompanying drawings shall be indicated with like reference numerals and similar features as shown in alternate embodiments in the Drawings shall be indicated with similar reference numerals.

Embodiments of the present invention include an emulator 10 and software therefor, which enables devices on a multiple device scan chain to be individually targeted for emulation/debugging operations. Particular embodiments of the present invention include JTAG compliant instructions that utilize boundary scan input and output cells to selectively bypass individual devices in the serial scan chain, to enable one or more selected devices to be coupled through the scan chain to the emulator/debugger 110. Examples of JTAG enabled (also referred to as JTAG compliant) devices that may be used in conjunction with embodiments of the present invention include the 6xx, 7xx and 82xx family of processors available from Motorola® (Palatine, IL), as well as POWERPC® (International Business Machines Corporation 'IBM', Armonk, N.Y.), 4xx (IBM), MIPS® (Mips Technologies, Inc., Mountain View Calif.), and ARM (Arm Limited, Cambridge, England) processors.

Alternate embodiments of the present invention may be used with other types of devices, such as IEEE 1149.1 compatible devices capable of in-circuit PAL, FLASH and FPGA programming. These alternative embodiments may provide features such as boundary scan signal display and in-circuit testing.

Where used in this disclosure, the term "emulator" is used in a manner familiar to those skilled in the art, namely, to refer to hardware and/or software configured to enable a host processor to run software designed for a target processor, and which may include a source-level debugger. For example, the term "emulator" may include the visionICE™ real-time in-circuit emulator, and/or visionPROBE™ hardware-assisted debugging & test tool products available from Wind River Systems, Inc. (Alameda, Calif.) alone or in combination. These products typically include a translation module (not shown), e.g., a Field Programmable Gate Array or the like, configured to translate emulation/debugging instructions into a format, such as JTAG, which is usable by the target device(s). Such an emulator, modified in accordance with embodiments of the present invention as described herein, is referred to as "emulator 110".

Referring now to Figures, the apparatus of the present invention will be more thoroughly described. Prior to discussing the configuration and function of embodiments of this invention, a brief discussion of JTAG boundary-scan architecture and operation is in order.

Turning to FIG. 1, in a JTAG compliant device 30, each primary input 40 and primary output 42 signal is supplemented with a multi-purpose memory element known as a boundary-scan cell 44. Cells 44 coupled directly to primary inputs 40 are generally referred to as "input cells." Similarly, cells 44 coupled directly to primary outputs 42 are referred to as "output cells." As used herein, when distinguishing between elements within a device, the terms "input" and "output" are defined relative to the core logic 46 of the device. The terms "input" and "output" may also be used herein to reference particular interconnects between two or more devices.

The collection of boundary-scan cells 44 is configured as a parallel-in, parallel-out shift register. A parallel load operation, referred to as a "capture" operation, causes signal values on device input pins 40 to be loaded into the input cells and, signal values passing from the core logic 46 to device output pins 42 to be loaded into the output cells. A parallel unload operation—called an "update" operation—causes signal values already present in the output scan cells to be passed out through the device output pins 42. Signal values already present in the input scan cells will be passed into the core logic 46.

Data may also be shifted around the shift register, in serial mode, starting from a dedicated device input pin referred to as "Test Data In" (TDI) pin 48 and terminating at a dedicated device output pin referred to as "Test Data Out" (TDO) pin 50. A test clock, TCK, is fed into clock pin 52 and the mode of operation is controlled by a dedicated "Test Mode Select" (TMS) pin 54.

At the device level, the boundary-scan elements 44 generally do not contribute to the functionality of the core logic 46. Rather, the boundary-scan path 62 (FIG. 2) is independent of the function of the device 30. The benefit of the scan path 62 is at the board level as shown in FIG. 2.

Figure 2:
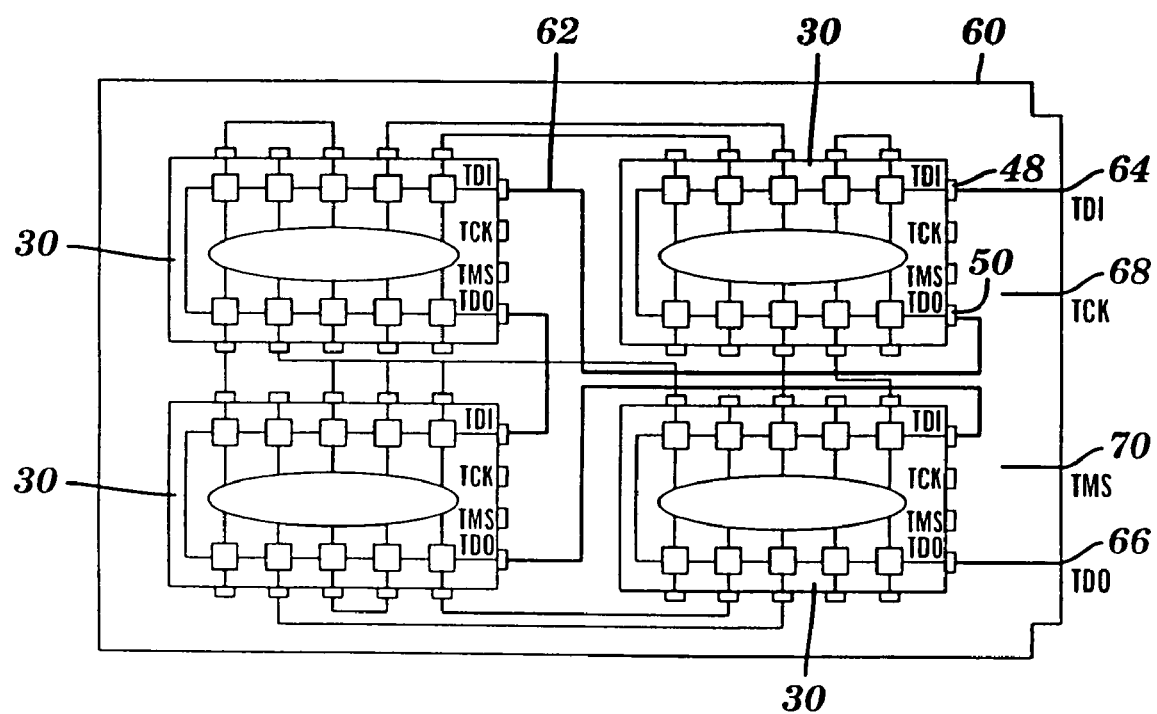

Turning now to FIG. 2, an exemplary board 60 contains four boundary-scan devices 30. The board 60 includes an edge-connector TDI input 64 connected to the TDI 48 of the first device. TDO 50 of the first device is connected to TDI 48 of the second device, and so on, creating a global scan path 62 terminating at an edge connector TDO output 66. TCK input 68 is connected in parallel (not shown) to each device TCK 52. TMS 70 is similarly connected in parallel (not shown) to each TMS 54.

Particular tests may be applied to the device interconnects via the global scan path 62—by loading the stimulus values into the appropriate device-output scan cells 44, by the process of entering a value into the edge connector TDI input 64 (i.e., using a "shift-in" operation), applying the stimulus ("update" operation), capturing the responses at device-output scan cells ("capture" operation), and shifting the response values out to the edge connector TDO (shift-out operation).

Using the boundary-scan cells to test the core functionality is called "internal test," shortened to Intest. Using the boundary-scan cells to test the interconnect structure between two devices is called "external test," shortened to Extest. The use of the cells for Extest is the major application of boundary-scan architecture, searching for opens and shorts plus damage to the periphery of the device. Intest has only typically been used for very limited testing of the core functionality (i.e., an existence test, to identify defects such as devices missing, incorrectly oriented, or misalignment.

Figure 3:
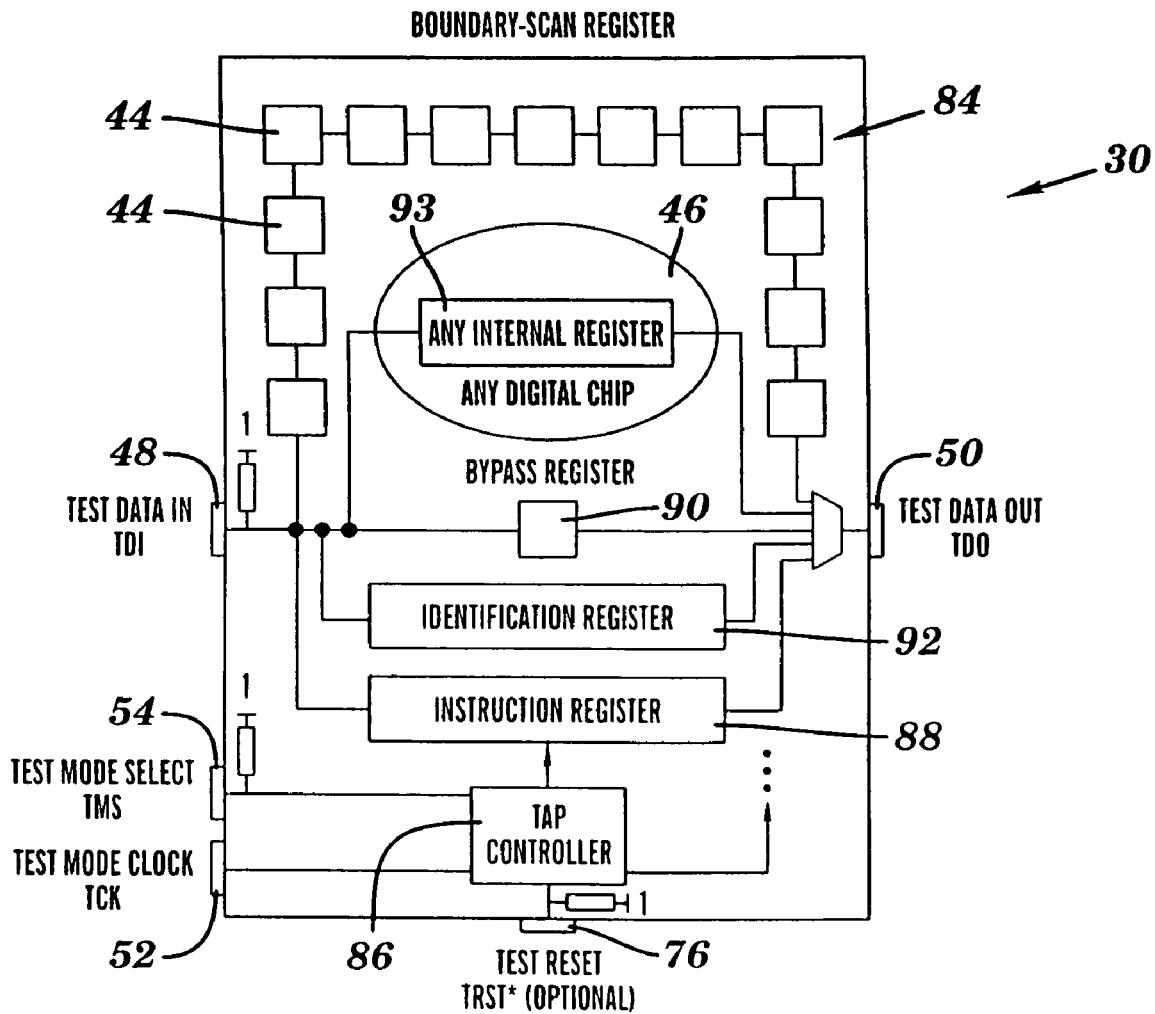

Turning now to FIG. 3, the JTAG architecture is shown in greater detail. As shown, device 30 includes Test Data In (TDI) 48, Test Mode Select (TMS) 54, Test Clock input (TCK) 52, Test Data Out (TDO) 50—and an optional test pin Test Reset (TRST) 76. These pins are collectively referred to as the Test Access Port (TAP).

A boundary-scan cell 44 directly coupled to each device primary input and primary output pin (not shown), are interconnected internally to form a serial boundary-scan register (Boundary Scan) 84.

Additional features include a finite-state machine TAP controller 86 having inputs coupled to TCK 52, TMS 54, and optionally, TRST 76. An n-bit Instruction Register (IR) 88 is provided to hold a current instruction. A 1-bit bypass register (Bypass) 90 is provided, and optionally, a 32-bit Identification Register (Ident) 92, capable of being loaded with a permanent device identification code, may also be included.

At any time, only one of the registers (e.g., 84, 88, 90, 92, or a register 93 within core 46) may be connected from TDI 48 to TDO 50. The selected register is identified by the decoded output of the IR. Certain instructions are mandatory, such as Extest (boundary-scan register selected), whereas others are optional, such as the Idcode instruction (Ident register selected).

Figure 4:
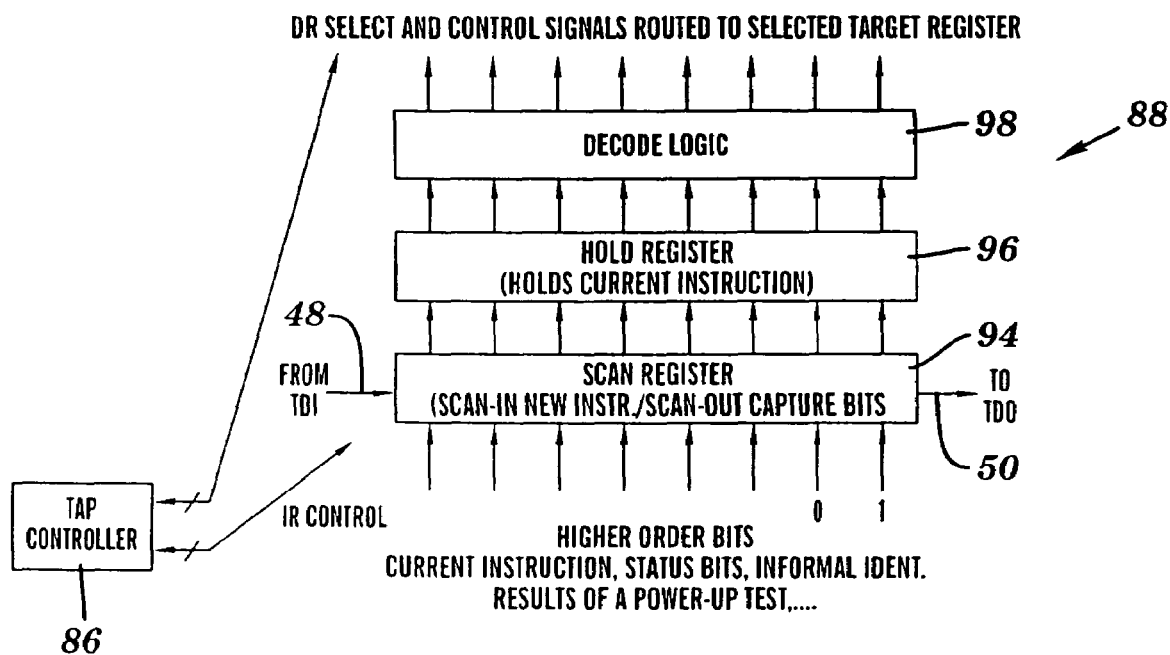

Turning now to FIG. 4, Instruction Register (IR) 88 includes a shift section (also referred to as a scan register) 94 that may be connected to TDI 48 and TDO 50, and a hold section 96, that holds a current instruction.

Typically, some decoding logic 98 may be associated with the two sections 94 and 96 depending on the width of the register and number of different instructions associated with the particular device 30. Control signals to the IR 88 originate from TAP controller 86 and either cause a shift-in, shift-out through the IR shift section 94, or cause the contents of the shift section 94 to be passed to the hold section 96 (i.e., an update operation). It is also possible to load (capture) certain known (e.g., "hard-wired") values into the shift section 94.

The IEEE 1149.1 Standard describes three instructions: Bypass, Sample/Preload, and Extest. The Bypass instruction is assigned an all-1s code and when executed, causes the Bypass register 90 (FIG. 3) to be placed between the TDI 48 and TDO 50 pins. By definition, the initialized state of the hold section 96 of IR 88 should contain the Bypass instruction unless the optional Identification Register (Ident) 92 has been implemented, in which case, the Idcode instruction is present in hold section 96.

The Sample/Preload instruction selects the boundary-scan register 84 when executed. This instruction sets up the boundary-scan cells 44 either to sample (capture) values moving in to the device 30 or to preload known (e.g., "hard wired") values into the output boundary-scan cells 44 prior to some follow-on operation.

The Extest instruction selects the boundary-scan register 84 when executed, preparatory to interconnect testing. The code for Extest is defined as the all-0s code.

The IEEE 1149.1 Standard also defines a number of optional instructions. Examples of optional instructions include: Intest, the instruction that selects the boundary-scan register 84 preparatory to applying tests to the core logic of the device; and Idcode, the instruction to select the Identification Register 92, preparatory to loading the Idcode code and reading it out through TDO 50.

Additional instructions include Clamp, which drives preset values onto the outputs of devices 30 (values which were established previously using the Sample/Preload instruction) and then selects the Bypass register 90 between TDI 48 and TDO 50 (unlike the Sample/Preload instruction). Clamp may be used to set up safe "guarding" values on the outputs of certain devices, for example, to avoid bus contention problems. Highz is similar to Clamp, but leaves the device output pins in a high-impedance state. Highz also selects the Bypass register 90 between TDI 48 and TDO 50.

Figure 5:
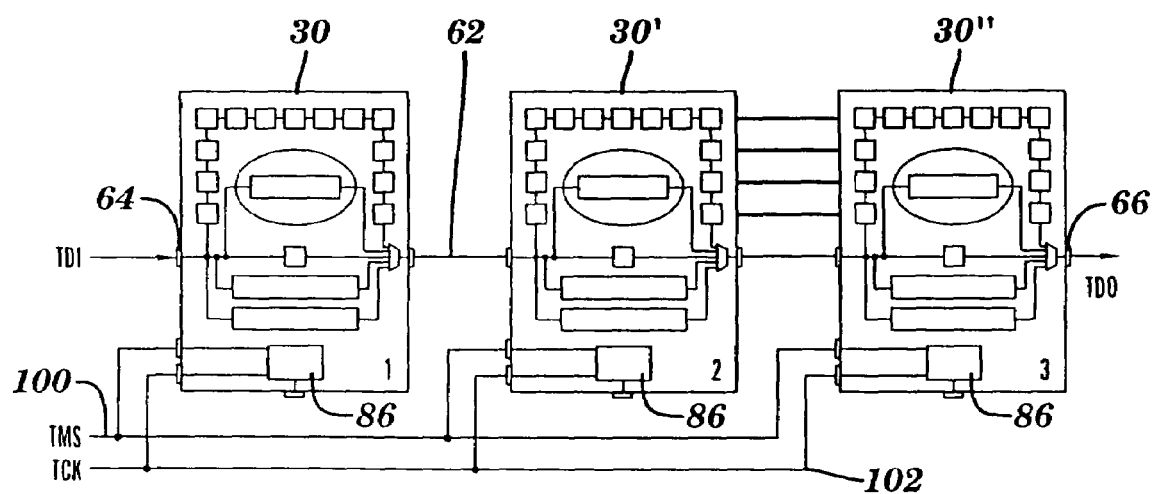

Turning now to FIG. 5, IR 88 (FIG. 3) loads and decodes its contents as follows. For example, one may wish to place device 30 (the first device in the chain) into bypass mode (to shorten the time it takes to get test stimulus to follow-on devices 30' and 30") and place devices 30' and 30" into Extest mode preparatory to setting up tests to check the interconnect between devices 30' and 30". This example requires loading the Bypass instruction (all-1s) into the IR 88 of device 30, and the Extest instruction (all-0s) into the IRs 88 of devices 30' and 30".

Step 1 in this example is to connect the IRs 88 (FIG. 3) of all three devices between their respective TDI 48 and TDO 50 pins. This is achieved by placing a predetermined sequence of values on the TMS control line 100 that is coupled in parallel to the TAP controller 86 of each device 30, 30', 30". (As shown, both the TMS line 100 and TCK line 102 are connected to all devices in parallel.) Any sequence of values on TMS line 100 will be interpreted in the same way by each TAP controller 86.

Step 2 is to load the appropriate instructions into the various IRs 88 through scan path 62 that now serially connects them to one another. In the event each IR 88 simply contains two-bits, this operation amounts to a serial load of the sequence 110000 into the edge-connector TDI 64 to place 00 in IR 88 of each device 30' and 30", and place 11 in IR 88 of device 30. The IRs 88 are now set up with the correct instructions loaded into their shift sections 94.

In step 3, values are placed on TMS line 100 to cause each TAP controller 86 to issue control-signal values that transfer the values in the shift sections 94 of the IRs 88 to hold sections 96 where they become the "current" instruction. This is the Update operation. At this point, the various instructions are obeyed—that is, device 30 deselects its IR 88 and selects its Bypass register 90 between its TDI 48 and TDO 50 (i.e., to execute its Bypass instruction). Devices 30' and 30" deselect their IRs 88 and select their boundary-scan registers 84 between their TDI 48 and TDO 50 (i.e., to execute their Extest instructions). The devices 30, 30', and 30" are now set up for the Extest operation.

Figure 6:
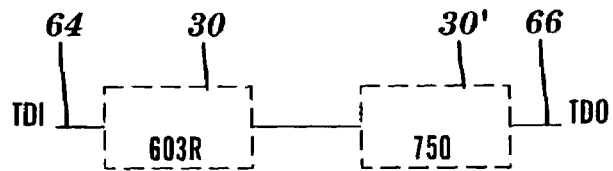
FIG. 6 is a schematic representation of an exemplary boundary scan chain used in connection with embodiments of the present invention.

Referring now to FIGS. 6-12 and the Tables included herein, embodiments of the present invention will be described in detail. Turning to FIGS. 6 and 7A, an embodiment of the present invention selects a single device within a scan chain 62, while placing the remaining devices into BYPASS mode. As mentioned hereinabove, this embodiment may be used with substantially any JTAG/IEEE 1149.1 compliant devices 30, 30', 30", etc. Embodiments of the present invention thus include adding counters and commands to low level JTAG drivers of emulator 110 to control the positioning and interaction between the emulator 110 and the target JTAG devices 30, 30', 30", 30''', etc., as will be discussed in greater detail hereinbelow.

The counters of these embodiments serve to hold the BYPASS overhead required to isolate a single device on multiple device scan chain 62. When communicating with any IEEE 1149.1 device, there are 2 phases that need to be maintained, an INSTRUCTION phase and a DATA phase. The changes that need to be made to each of these 2 phases are discussed below.

In the instruction phase, the emulator 110 (FIG. 7A) provides bypass commands for devices before and after the device being accessed. In order to send a command to the selected device, the command is positioned within a serial bit stream so that when the bit stream is sent down the scan chain 62, the command ends up in the proper device. This is accomplished by collecting all the instruction register lengths from each device 30, 30', etc., and calculating how many bypass bits are required before and after the selected device. The emulator 10 is then able to determine the proper location for the command being sent to the selected device.

The data phase typically follows the instruction phase, once all devices 30', etc., (except for the device 30 being accessed) have been placed into bypass mode. The bypass command definition dictates that while in the data phase, each device 30', etc., in bypass mode will add one bit to the bit stream passing between the TDI 64 and TDO 66. The emulator 10 (FIG. 7A) accounts for this so that the data retrieved/delivered to/from the selected device 30', etc., may be properly positioned within the bit stream, so that the information is processed by the emulator 110 correctly.

The emulator 110 includes two configuration (CF) options: CF DEVNUM (Device Number) <value>, and CF DEVALT (Device Alternate) <value>. As will be discussed in greater detail hereinbelow, the DEVNUM (device number) is a specially formatted number that corresponds to a particular selected device 30 within the scan chain 62, 62', etc. The DEVALT is a similarly formatted number corresponding to one of the other devices 30', 30", etc., within the scan chain, which device is placed into Bypass mode. In particular embodiments of the present invention, the DEVALT devices 30', 30", etc., are in the same processor family as the DEVNUM device 30. The DEVALT device(s) may be started/stopped, and monitored, while the DEVNUM device 30 may be emulated/debugged in a conventional manner using emulator 110. Operations in the DEVALT devices are typically executed asynchronously with (e.g., after) the DEVNUM device 30. For example, if a user halts operation of the DEVNUM device 30, the DEVALT device(s) 30', 30", etc., will be stopped after the DEVNUM device 30 is halted.

The use of the DEVNUM and DEVALT configuration options allow the user to change the parameters related to the positioning of the selected devices 30, 30', etc., within the scan chain 62. The default value for these options is NORMAL (0x00000001). This default value informs the drivers of emulator 110 that there is only one device 30 on the scan chain 62. Emulator 110, through the use of integrated software and/or hardware, automatically generates the DEVNUM and/or DEVALT value based on the topology of the board design, in a manner that will become apparent to those skilled in art in light of the discussion hereinbelow. The topology of the board 60, 60' including the specific devices and their locations on the board, may be obtained by user input, as described hereinbelow with respect to FIG. 9. Alternatively, emulator may interrogate the target board 60, 60', to determine the topology.

For multiple device scan chains 62, the DEVNUM (and DEVALT) value is broken up into 5 fields as shown in Table 1 below. The first 4 fields of the DEVNUM/DEVALT are the counters that position the selected device 30, 30', etc., on the scan chain 62 as discussed hereinabove. The fifth field is reserved for various commands.

TABLE 1

| IR HEAD | | IR TAIL | | DR HEAD | | DR TAIL | | COMMANDS | |
|---|---|---|---|---|---|---|---|---|---|
| 0 | 7 | 8 | 15 | 16 | 21 | 22 | 27 | 28 | 31 |

In the exemplary embodiment shown in Table 1, the DEVNUM and DEVALT registers are 32 bits in length. The maximum number of devices before or after the selected device 30, etc., is 64. The maximum number of Instruction Register bits before or after the selected device 30, etc., is 256, as will be discussed in greater detail hereinbelow.

The IR-HEADER represents the number of instruction register bypass bits required BEFORE the selected device's instruction register data. In this embodiment, the IR-HEADER is 8 bits, to enable up to 256 bits before the selected device 30.

The IR-TAIL represents the number of instruction register bypass bits required AFTER the selected device's instruction register data. As shown, this field is also 8 bits long, to enable up to 256 bits after the selected device 30.

The DR-HEADER represents the number of data register bypass bits required BEFORE the selected device's bit stream. This value is used as an append to the bit stream during READ cycles. This field is 6 bits long. Since each bypassed device requires 1 bit as discussed above, the DR-HEADER field enables up to 64 devices before the selected device 30.

The DR-TAIL represents the number of data register bypass bits required AFTER the selected device's bit stream. This value is used as an append to the bit stream during WRITE cycles. As with the DR-HEADER, this field is 6 bits long, to enable up to 64 devices after the selected device 30.

The COMMANDS field represents a control mask for the low-level JTAG drivers. These bits can be masked together to select multiple operations. The COMMANDS field may also be used to control an alternate device(s) on the same scan chain. Support is available for up to 4 alternate devices. These devices generally receive commands asynchronously relative to the selected device (e.g., a command may be received by the selected device prior to receipt by the other devices). Examples of such commands receivable by the device(s) are included in Table 2 below:

TABLE 2

Command option 0x00: This command is a NOP that indicates there are no alternate devices present. Commands will only be sent to the selected device defined by the DEVNUM value.
Command option 0x01: This command is used to monitor the selected device and also all alternate devices for STOPPED state. If a stopped state is detected, all processors will be forced into stopped state. This process is NOT synchronous, and the processors stopped by the emulator may have executed many more lines of code than the initially stopped processor.
Command option 0x02: In the event a RUN command is issued to the selected device, all alternate devices will also be issued RUN commands.

TABLE 2-continued

This process may not be synchronous, so the selected device may receive the RUN command first, followed by alternate devices #1 through # 4, respectively.
Command option 0x04: In the event a HALT command is issued to the selected device, all alternate devices will also be issued HALT commands. This process may not be synchronous, so the selected device may receive the HALT command first, followed by alternate devices #1 through # 4, respectively.
Command option 0x08: Reserved for future use.

Turning now to FIG. 6, an example of a scan chain 62' extending from TDI 64 to TDO 66, and having two devices 30 and 30' thereon, is shown. In this example, both devices 30 and 30' are POWERPC® processors. Both devices have an instruction register 88 that is 8 bits long. The first device 30 is a model 603R, and the second device 30' is a model 750 processor.

For the emulator 110 (FIG. 7A) to communicate with device 30 (the 603R), the DEVNUM register must be determined. In this example, the IR-HEADER of the DEVNUM register will be zero, to indicate that there are no devices preceding it in the chain 62'. The IR-TAIL will be 8, to indicate that subsequent devices (e.g., device 30') in the chain 62' have a sum total of 8 bits in their Instruction Registers 88. Similarly, the DR-HEADER will be zero, since it is the first device, and the DR-TAIL will be 1 to indicate that there is one device 30' following device 30. So the DEVNUM (with a 0 in the Command field) is 0-8-0-1-0, which in hexadecimal becomes 0x00080010.

To communicate with the device 30' (the 750), the IR-HEADER of this DEVNUM register will be 8, and IR-TAIL will be zero. The DR-HEADER will be 1, and the DR-TAIL will be zero. So the DEVNUM (with a 0 in the Command field) in this instance will be 8-0-1-0-0, which in hex, becomes 0x08000400.

Figure 7A:
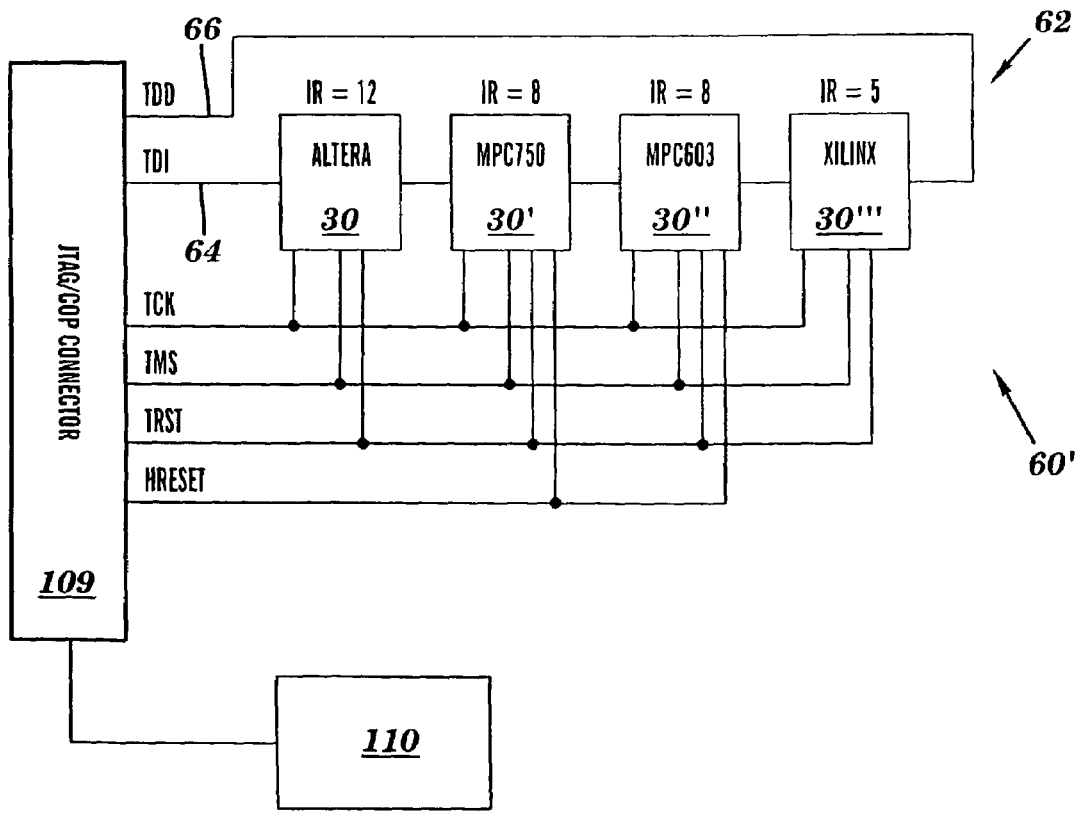
FIG. 7A is a schematic representation of an embodiment of the present invention, including an exemplary boundary scan chain.

Turning now to FIG. 7A, an exemplary scan chain 62 having four device 30, 30', 30", and 30''' is shown coupled through a JTAG connector 109 to emulator/debugger 110. Both devices 30' and 30" have an instruction register length of 8 bits, device 30 has an IR length of 12 and device 30''' has an IR length of 5. The total IR length (of all devices combined) is 33 bits. Table 3 below illustrates how the DEVNUM fields change based on position of the particular device 30, etc., on the scan chain 62.

As shown in Table 3, to enable emulator 110 to communicate with device 30', the IR-HEADER will be 13, and IR-TAIL will be 12. The DR-HEADER will be 2, and the DR-TAIL will be 1. This corresponds to a DEVNUM=0x0D0C0810.

TABLE 3

| DEVICE | DEVNUM | IR-HEADER | IR-TAIL | DR-HEADER | DR-TAIL |
| --- | --- | --- | --- | --- | --- |
| PGA (30) | 0x15000C00 | 21 | 0 | 3 | 0 |
| 750 (30') | 0x0D0C0810 | 13 | 12 | 2 | 1 |
| 603R (30") | 0x05140420 | 5 | 20 | 1 | 2 |
| PAL (30''') | 0x001C0030 | 0 | 28 | 0 | 3 |

As mentioned hereinabove, the emulator 110 may be provided with a command that will interrogate the target board 60' to automatically determine the number of devices 30, etc., in the chain 62, and the total number of bits in the IRs 88. With this information, emulator 110 may then calculate the DEVNUM and/or DEVALT values in the manner described hereinabove, and then display the information, such as shown in the following Table 4.

TABLE 4

>BKM>cf DEVNUM 0d0c0810
>BKM>sy jtag stat
Total number of devices on the scan chain = 4
Total IR Register Length    = 33
Selected Device Number    = 0x0d0c0810
IR bits BEFORE and AFTER the SELECTED part = 13 -> 12
DR bits BEFORE and AFTER the SELECTED part = 2 -> 1
Emulation Control for the ALTERNATE devices = NONE.
>BKM>

Figure 7B:
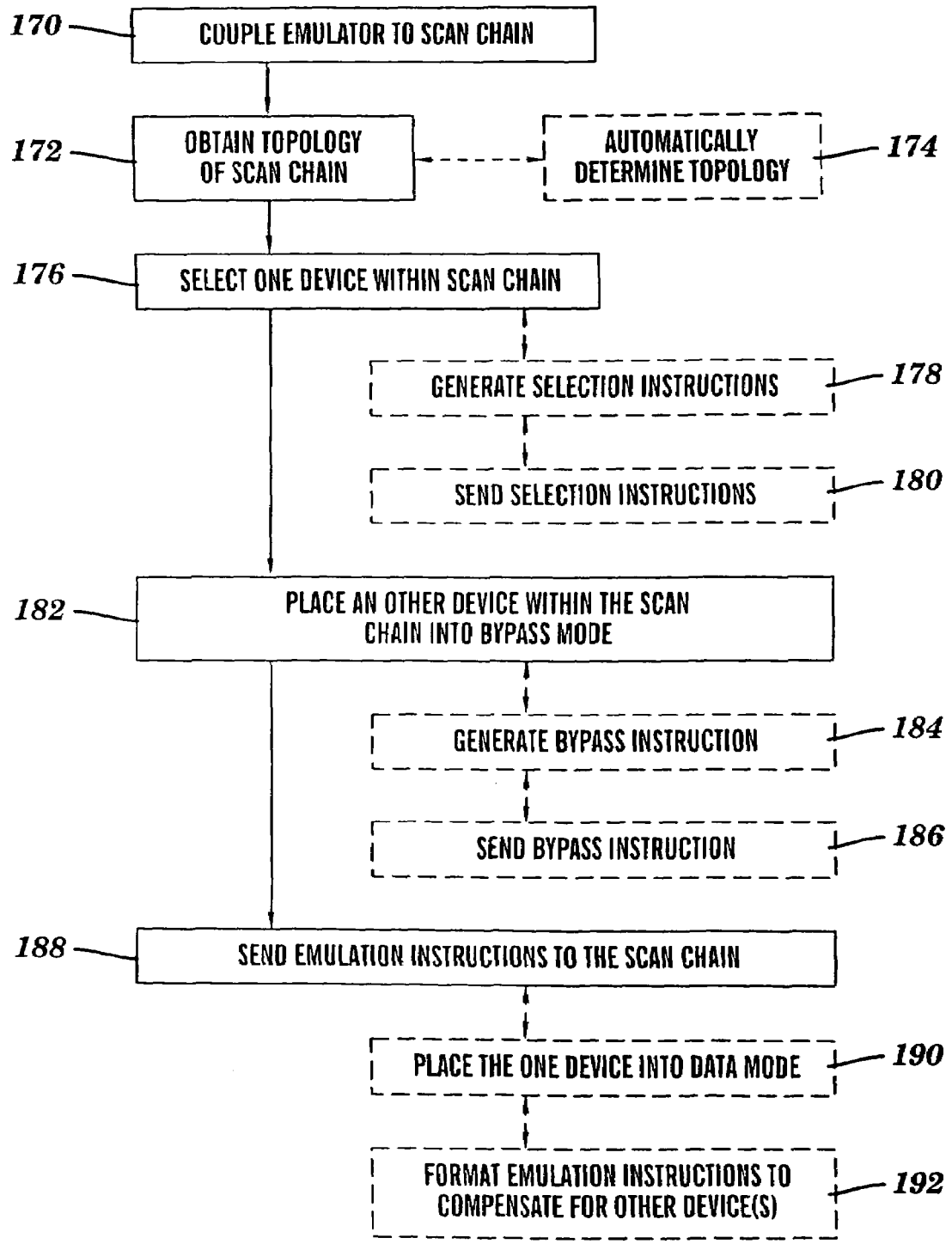
FIG. 7B is a block diagram of an embodiment of a method of emulating a device, in accordance with the present invention, with optional portions thereof shown in phantom.
Figure 7C:
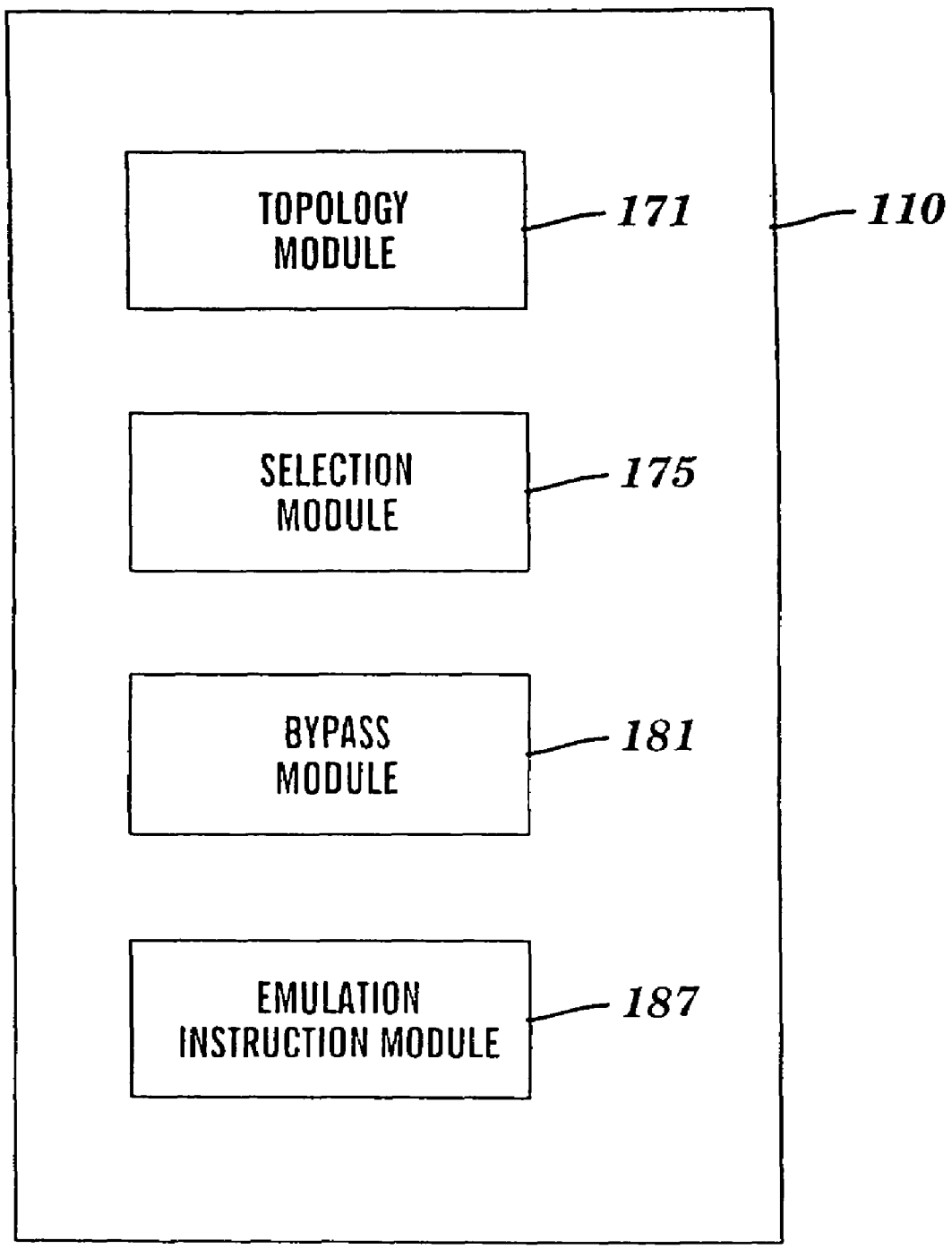
FIG. 7C is a block diagram of the emulator of the embodiment of FIG. 7A.

An exemplary embodiment of emulator 110 configured to implement various aspects of the present invention is shown in FIG. 7C. As shown, emulator 110 includes a topology module 171 configured to obtain 172 (FIG. 7B) the topology of the scan chain, and a selection module 175 configured to select 176 (FIG. 7B) one device within the scan chain. A bypass module 181 is configured to place 182 (FIG. 7B) at least one other device within the scan chain into bypass mode. An emulation instruction module 187 is also included, to send 188 (FIG. 7B) emulation instructions to the scan chain, so that the emulation instructions bypass the unselected device(s) and are executed by the selected device.

Referring now to FIG. 7B, an exemplary method for emulating individual JTAG devices in a multiple device boundary scan chain in accordance with the teachings of the present invention is discussed. As shown, this method includes coupling 170 emulator 110 (FIGS. 7A and 7C) to the scan chain, and obtaining 172 the topology of the scan chain 62, 62' (FIGS. 6 & 7A), e.g., using topology module 171 (FIG. 7C). This obtaining 172 may be effected by the user inputting the information. Alternatively, module 171 (FIG. 7C) may automatically 174 determine the topology in the manner described hereinabove. The method further includes selecting 176 one device 30 (FIG. 7A) within the scan chain, such as by using selection module 175 (FIG. 7C). As shown in phantom, selecting 176 may optionally include generating 178 a selection instruction such as described hereinabove, and sending 180 the selection instruction to the scan chain. The method further includes placing 182 at least one other device 30' within the scan chain 62 into bypass mode, using bypass module 181 (FIG. 7C). As also shown in phantom, placing 182 may optionally include generating 184 a bypass instruction such as described hereinabove, and sending 186 the bypass instruction to the scan chain. The skilled artisan will recognize that the selecting 176 and placing 182 steps need not be effected in any particular order. Once steps 176 and 182 have been completed, emulation instructions may be sent 188 (e.g., using emulation instruction module 187 of FIG. 7C) to the scan chain, which may then bypass the other device 30' and are executed by the one device 30. In a particular optional embodiment, step 188 may include placing 190 the one device 30 into data mode, and/or formatting 192 the emulation instructions to compensate for the other device(s).

Turning now to FIGS. 8-12, examples of a GUI associated with emulator 110 of the present invention is shown. In this embodiment, the GUI includes the above-referenced vision-XTREME™ product modified in accordance with teachings of the present invention.

Figure 8:
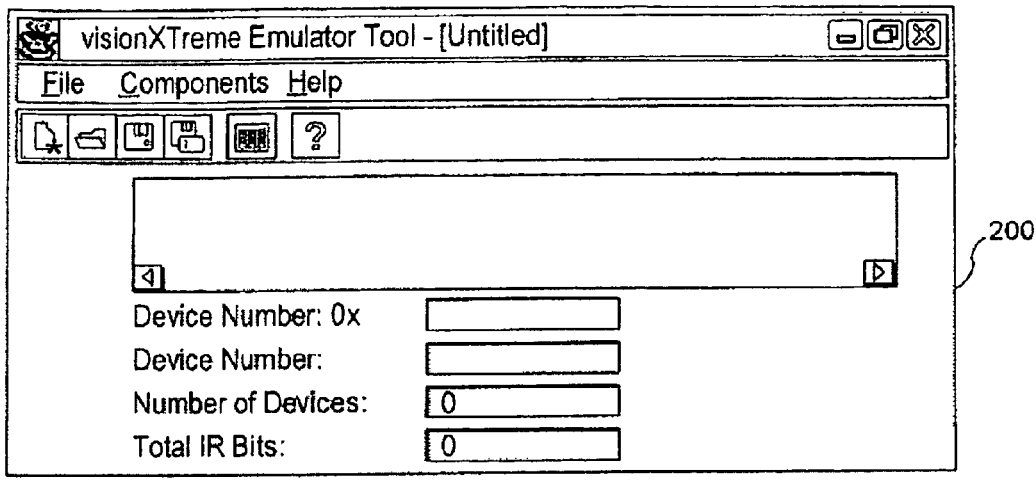
FIG. 8 is a first screen display of a graphical user interface of the present invention.

Referring to FIG. 8, once a user couples emulator 110 to a scan chain 62, 62', etc., substantially as shown in FIG. 7A, to start a new project, the GUI displays a project window 200.

The window 200 may be blank, and all data associated to the window may also be blank. Window 200 helps enable the user to define the serial scan chain 62, etc., including the topology thereof, on a particular board 60.

Figure 9:
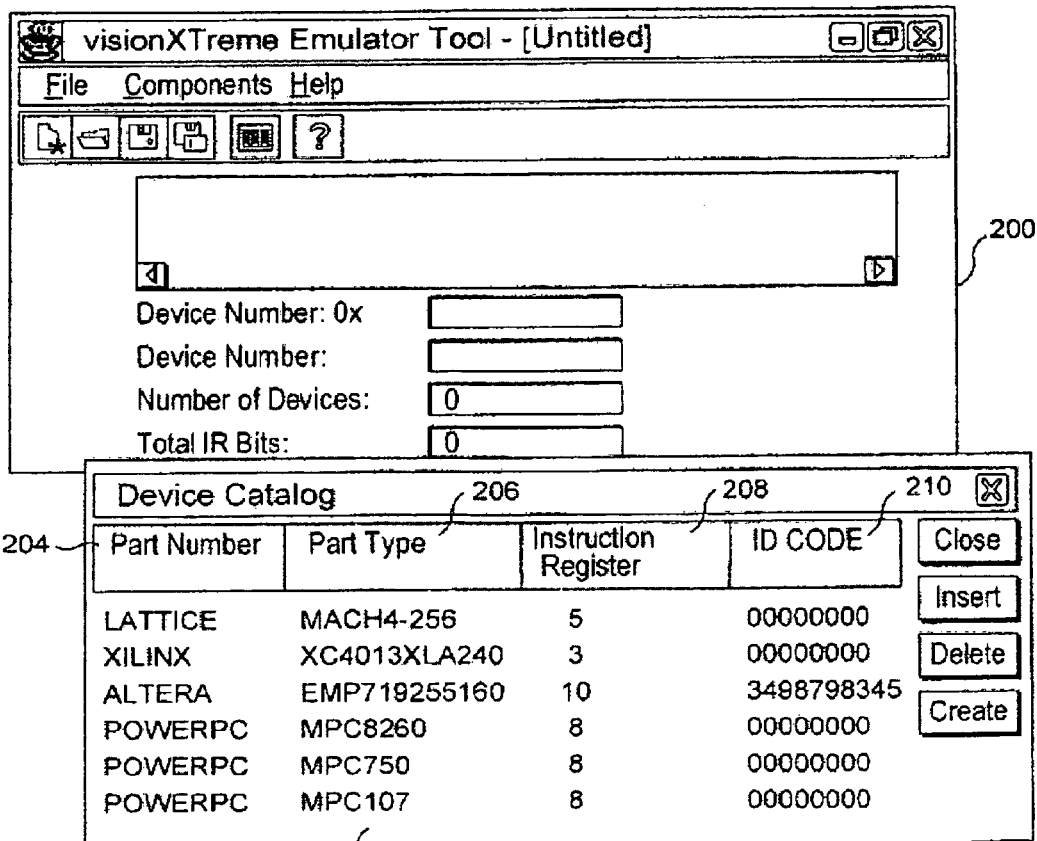
FIG. 9 is a second screen display of a graphical user interface of the present invention.

Turning to FIG. 9, the GUI enables the user to select devices from a list (e.g., library) 202. The library 202 includes various devices 30, 30', etc., listed by manufacturer name 204, type 206, instruction register length 208, and the vector ID code 210. The vector ID code 210 is typically assigned by the manufacturer. The user may select one of the devices 30 from the list, or alternatively, the user may add new devices to the library 202 by entering the corresponding parameters thereof, including the instruction register length 208 and the vector ID code 210.

Figure 10:
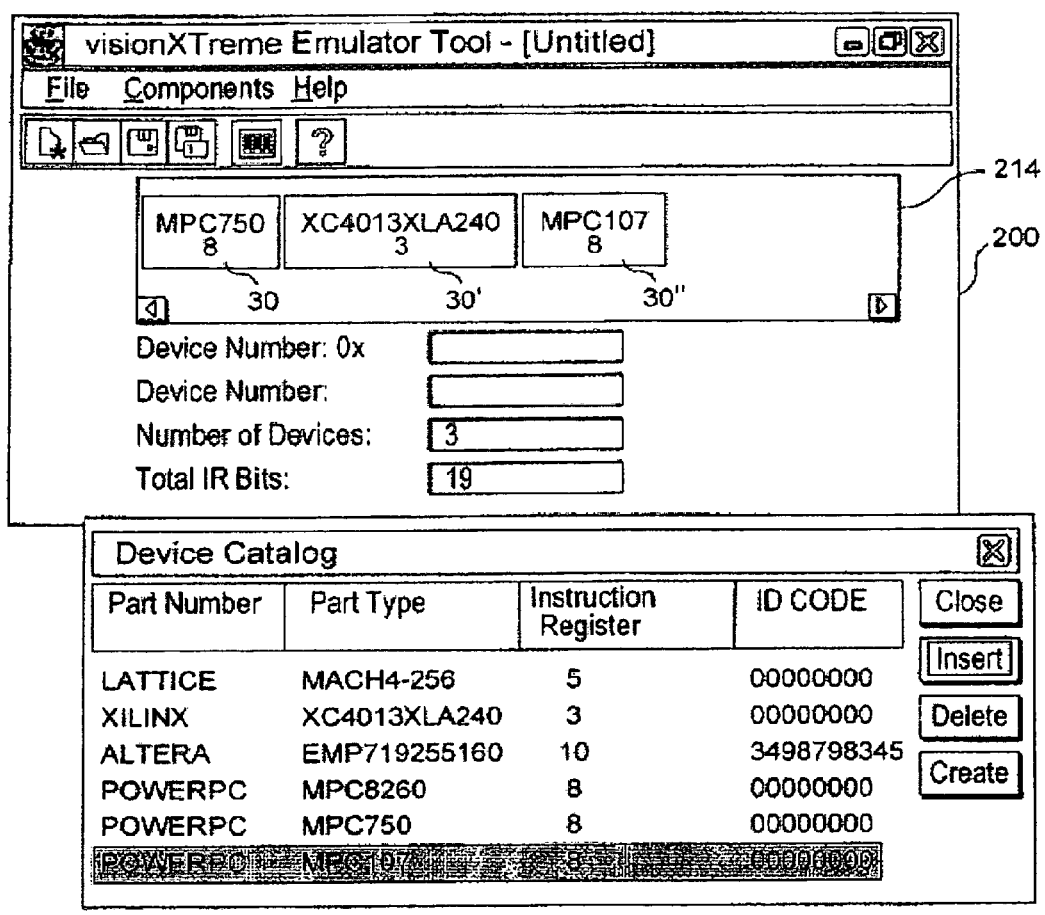
FIG. 10 is a third screen display of a graphical user interface of the present invention.

Referring now to FIG. 10, once devices 30, 30', etc., in the particular scan chain have been added, the project window 200 displays a graphical representation 214 of the topology (e.g., the order of the devices within the scan chain) of the board 60. These devices may be displayed serially based on the flow of data from TDI 64 to TDO 66 (FIG. 7A). As shown, the left most device 30 is the first device seen by the emulator 110. The right most device 30" is the last device on the particular scan chain 62, 62', etc. The specific topology may be entered by the user, or alternatively, the emulator 110 may determine the topology automatically such as described with respect to Table 4 hereinabove.

Figure 11:
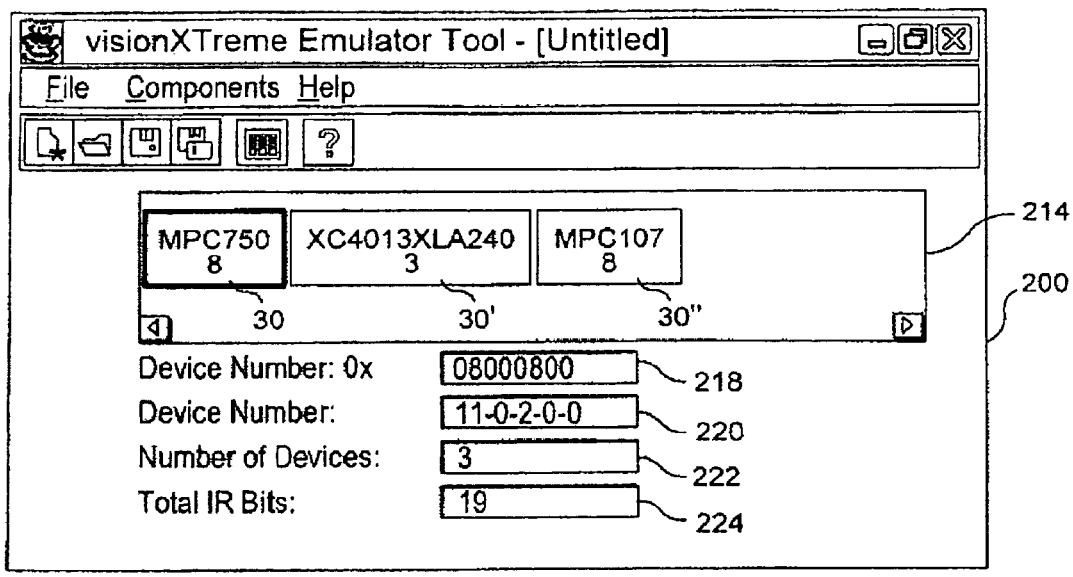
FIG. 11 is a fourth screen display of a graphical user interface of the present invention.
Figure 12:
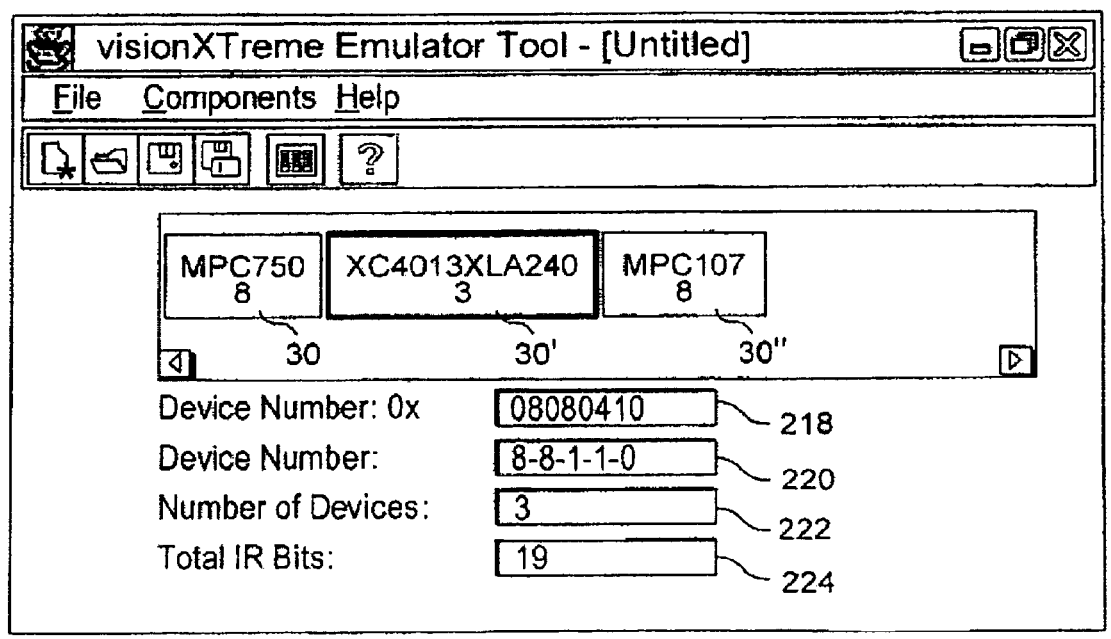
FIG. 12 is a fifth screen display of a graphical user interface of the present invention.

Turning now to FIGS. 11 and 12, the user may select a particular device (e.g., by clicking on the particular device in the graphical representation 214) to display information about this device. In the examples shown, device 30" was selected in FIG. 11, while device 30' was selected in FIG. 12. Window 200 will then display the DEVNUM in both hexadecimal and decimal notation in fields 218 and 220, respectively.

The total number of devices 30, etc., in the scan chain 62, etc., is shown in field 222, while the total number of instruction register bits in the entire chain is shown in field 224.

Once a particular device is selected as shown, emulator 110 places the devices within the scan chain 62, 62' into their data phases. (This is accomplished in a conventional manner, i.e., by sending a predetermined signal to TMS line 100 to cause each TAP controller 86 to issue control-signal values that place the devices into the data phase.)

The emulator 110 may then generate conventional emulation/debugging commands, which are modified as described hereinabove to compensate for the bits added by the bypassed devices 30', etc, as the bit stream passes between the TDI 64 and TDO 66, to properly position the particular commands. The emulator 110 also accounts for bits added by downstream bypassed devices so that the data delivered to the emulator from the selected device 30, etc., may be properly processed.

In connection with each command sent to the selected device 30, emulator 110 executes one or more of the aforementioned Update operation(s) to transfer the values in the shift section 94 of IR 88 of selected device 30, to hold section 96 (FIG. 4) where it becomes the "current" instruction and is processed by the device 30. Emulator 110 may now provide emulation/debugging services in a manner consistent with a conventional single chip JTAG emulation environment.

In the preceding specification, the invention has been described with reference to specific exemplary embodiments thereof. It will be evident that various modifications and changes may be made thereunto without departing from the broader spirit and scope of the invention as set forth in the claims that follow. The specification and drawings are accordingly to be regarded in an illustrative rather than restrictive sense.

Having thus described the invention, what is claimed is:

1. A method, comprising:
coupling an emulator to a multiple boundary device scan chain;
selecting one device within the scan chain; and
sending, by an emulator, emulation instructions to the scan chain, wherein the instructions are executed by the selected device and bypass at least one other device.

2. The method of claim 1, wherein the execution of the instructions results in the emulation of individual JTAG devices.

3. The method of claim 1, wherein the step of selecting one device, further includes:
generating selection instructions; and
sending selection instructions to the scan chain.

4. The method of claim 1, further comprising placing the at least one other device into a bypass mode.

5. The method of claim 1, wherein the placing of the at least one other device into bypass mode includes:
generating a bypass instruction; and
sending the bypass instruction to the scan chain.

6. The method of claim 1, wherein the step of sending emulation instructions to the scan chain includes at least one of placing the selected device into data mode and formatting the emulation instructions to compensate for the at least one other device.

7. A system, comprising:
an emulator couplable to a multiple boundary device scan chain;
a selection module configured to select one device within the scan chain; and
an emulation instruction module configured to send emulation instructions to the scan chain, wherein the instructions are executed by the selected device and bypass at least one other device in the scan chain.

8. The system of claim 7, wherein the emulator is configured to enable a host processor to run software designed for a target processor.

9. The system of claim 7, wherein the emulator includes a source-level debugger.

10. The system of claim 7, wherein the emulator is configured to emulate individual JTAG devices in a multiple device boundary scan chain.

11. The system of claim 7, further comprising a graphical user interface (GUI) for the emulator.

12. The system of claim 11, wherein the GUI allows selection of one of the devices of the scan chain from a list.

13. The system of claim 11, wherein the GUI provides an interface for a user to manipulate a topology of the scan chain.

14. The system of claim 7, further comprising a topology module configured to obtain a topology of the scan chain.

15. The system of claim 7, further comprising a bypass module configured to place at least one other device within the scan chain into a bypass mode.

16. The system of claim 7, wherein the emulator includes a configuration option which corresponds to the selected device, and a configuration option which corresponds to the other devices within the scan chain.

17. The system of claim 16, wherein the configuration options allow a user to change the parameters related to the positioning of the selected devices within the scan chain.

18. The system of claim 7, wherein the emulator places the devices within the scan chain into their data phases.

19. The system of claim 18, wherein the emulator is configured to generate conventional emulation/debugging commands.

20. A computer-readable storage medium containing a set of instructions executable by a processor, the set of instructions comprising:
a selection routine for selecting one device within a multiple boundary device scan chain;
a bypass routine for placing at least one other device within the scan chain into a bypass mode; and
an emulation routine, which responds to the selection routine and the bypass routine, for emulating individual JTAG devices within a multiple boundary device scan chain.

* * * * *